(12) United States Patent
Wada (10) Patent No.: US 6,410,947 B1
(45) Date of Patent: Jun. 25, 2002

(54) SEMICONDUCTOR DEVICE AND PROCESS OF PRODUCTION OF SAME

(75) Inventor: Shinichi Wada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/570,444

(22) Filed: May 12, 2000

(30) Foreign Application Priority Data

May 19, 1999 (JP) ............................................. 11-138759

(51) Int. Cl.⁷ ........................................... H01L 31/0328
(52) U.S. Cl. ........................ 257/194; 257/192; 257/195; 257/20; 257/24; 257/155; 257/29; 257/189; 257/190; 438/167; 438/172; 438/285; 438/571; 438/590
(58) Field of Search ................................ 257/194, 192, 257/20, 24, 155, 27, 189, 190, 195; 438/285, 590, 167, 172, 571

(56) References Cited

U.S. PATENT DOCUMENTS 5,172,197 A * 12/1992 Nguyen et al. ............... 357/22

FOREIGN PATENT DOCUMENTS

JP            63-197379 A   *   8/1988

* cited by examiner

Primary Examiner—Tom Thomas
Assistant Examiner—Donghee Kang
(74) Attorney, Agent, or Firm—Sonnenschein, Nath & Rosenthal (57) ABSTRACT

A semiconductor device operable with a single positive power source, enabling an increase in efficiency, and improved in high-frequency characteristics by lowering the resistivity of a gate contact, including a carrier run layer formed on a substrate for running of carriers; a carrier supply layer formed on the carrier run layer, having a larger bandgap than the carrier run layer, and containing a first conductivity type impurity; a barrier layer formed on the carrier supply layer and having a smaller bandgap than the carrier supply layer; a source electrode and a drain electrode formed on the barrier layer at a predetermined distance from each other; a gate electrode formed on the barrier layer between the source electrode and the drain electrode away from the source electrode and the drain electrode; and a first low resistivity region formed at least below the gate electrode in the barrier layer and containing a second conductivity type impurity opposite in conductivity to the first conductivity type, and a process of production of the same.

19 Claims, 3 Drawing Sheets

SEMICONDUCTOR DEVICE AND PROCESS OF PRODUCTION OF SAME

BACKGROUND OF THE INVENTION

1. Field of the Invention

The present invention relates to a semiconductor device and a process of production of the same, more particularly relates to a hertero-junction filed effect transistor applicable to a microwave communications device and a process of production of the same.

2. Description of the Related Art

In recent years, in cellular phone and other mobile communications system, miniaturization and reduction of power consumption of terminals have been strongly sought. Therefore, the transistors and other devices used for terminals have been miniaturized and reduced in power consumption. For example, ICs for power amplifiers used for digital cellular phones, now becoming the mainstream in mobile communications are being required to operate with a single positive power source, be driven by a lower voltage, and operate at a higher efficiency.

One of the devices used for power amplifiers is the hetero-junction field effect transistor (HFET). The currently mass produced HFETs use electrons as carriers and are often called "high electron mobility transistors" (HEMTs). In HEMTs, the hetero-junction formed between the layer in which the electrons run (channel layer) and the layer supplying the electrons (doping layer) is used for current modulation.

HFETs differ in channel structure from conventional junction FETs or Schottky junction field effect transistors (MESFETs; metal semiconductor FETs). In HFETs, carriers are stored in the channel layer by supplying a positive voltage to the gate electrodes. Therefore, HFETs are characterized by a superior linearity of a gate-source capacitance $C_{gs}$ and mutual conductance $G_m$ to a gate voltage $V_g$ good compared with JEFTs, MESFETs, and other devices. This characteristic of HFETs is advantageous for improving the efficiency of a power amplifier.

Figure 3:
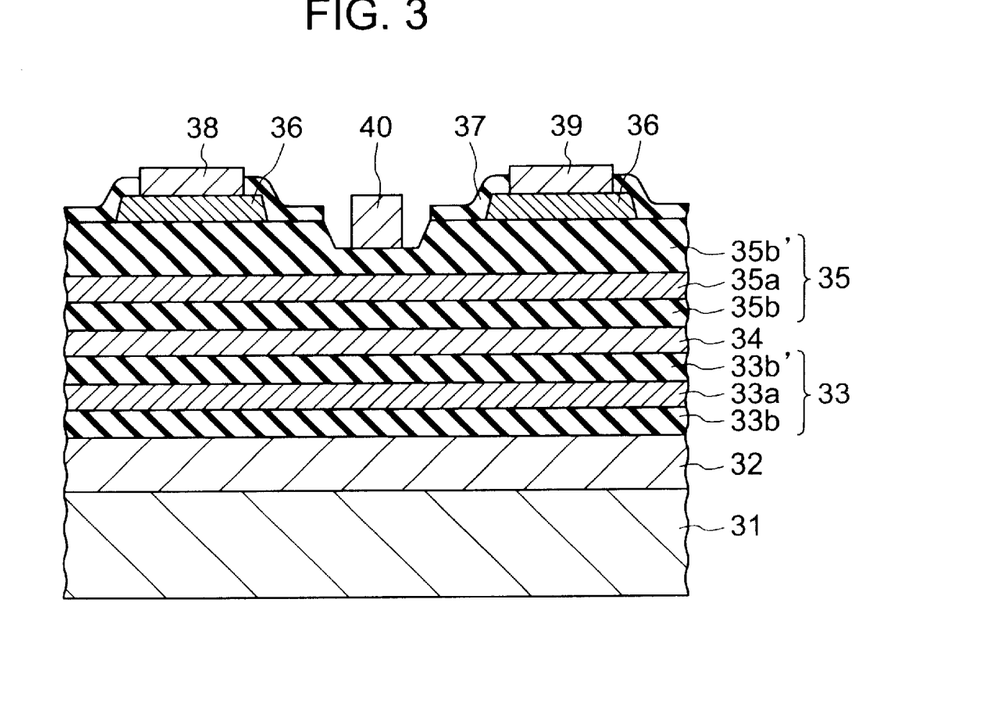
FIG. 3 is a cross-sectional view of a conventional hertero—junction field effect transistor.

FIG. 3 is a cross-sectional view of an example of the configuration of an HFET. In the HFET shown in FIG. 3, a first barrier layer 33, a channel layer 34, and a second barrier layer 35 are sequentially stacked on a semi-insulating GaAs substrate 31 via a buffer layer 32 comprised of a semi-insulating GaAs single crystal.

The first barrier layer 33 is for example made of an AlGaAs or other III–V compound semiconductor and is structured as a carrier supply region 33a containing an n-type impurity sandwiched between high resistivity layers 33b, 33b'. As the material of the channel layer 34, a semiconductor having a smaller bandgap than the first barrier layer 33 and the second barrier layer 35, such as InGaAs, is used. The second barrier layer 35 is for example made of AlGaAs or another compound semiconductor and is structured as a carrier supply region 35a containing an n-type impurity sandwiched between high resistivity layers 35b, 35b'.

Cap layers 36 formed on the second barrier layer 35, and the cap layers 36 are covered with an insulating layer 37 comprised of for example a silicon nitride film. A source electrode 38 and a drain electrode 39 are formed I contact holes formed in the insulating layer 37. Also, gate electrode 40 is formed on the second barrier layer 35. When applying voltage to the gate electrode 40, the current between the source electrode 38 and the drain electrode 39 is modulated.

Generally, in HFETs, as shown in FIG. 3, a recess structure in which a thickness of the second barrier layer 35 is made thinner near the gate 40 is often employed. When the recess structure is employed, carriers in the channel layer 34 below the gate electrode 40 become easier to deplete.

Figure 4:
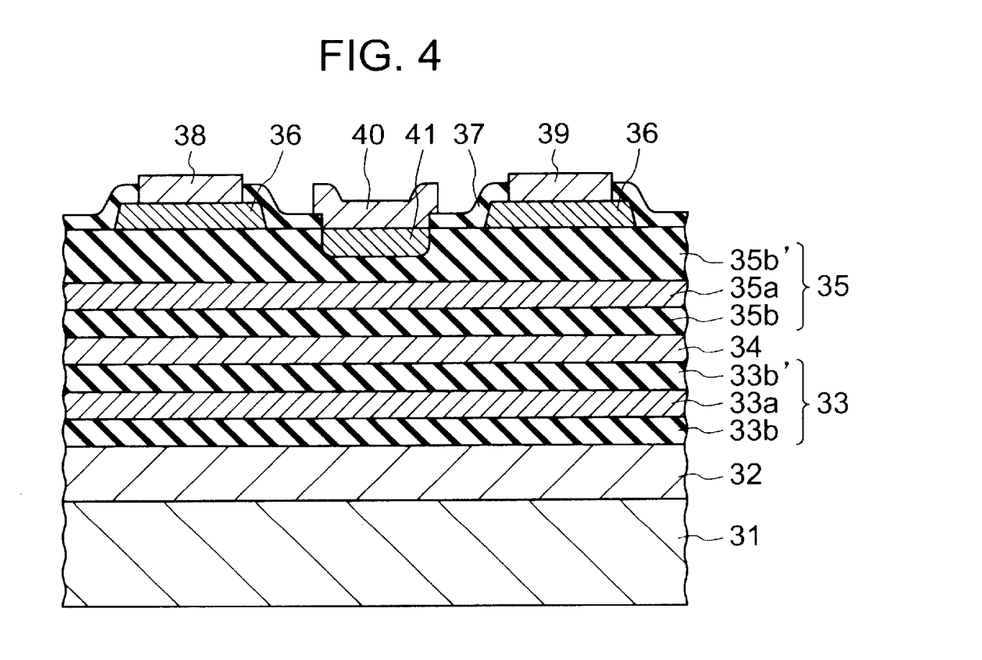
FIG. 4 is a cross-sectional view of another conventional hetero-junction field effect transistor.

Further, an HFET of a structure shown in FIG. 4 has also been recently proposed. In the HFET shown in FIG. 4, there is no recess as shown in FIG. 3 below the gate electrode 40, but a p-type low resistivity region 41 containing a p-type impurity is formed. The p-type low resistivity region 41 contacts the gate electrode 40 and is formed buried in the second barrier layer 35. The rest of the parts are the same as in the structure of the HFET shown in FIG. 3.

The p-type low resistivity region 41 is formed by diffusing a p-type impurity, for example, Zn, at a high concentration (for example $1=10^{19}$ atoms/cm$^3$) in part of the second barrier layer 35, specifically, the high resistivity layer 35b'.

In the case of the structure shown in FIG. 4, a pn junction is formed below the gate electrode 40. Therefore, a built-in voltage is made larger compared with the case where a Schottky contact is formed at the gate electrode part as shown in FIG. 3 and it is made possible to supply a higher positive voltage to the gate electrode. Due to this, operation with a single positive power source is enabled and a negative power source circuit becomes unnecessary. Also, in the case of the structure shown in FIG. 4, the good linearity of the mutual conductance $G_m$ and the gate-source capacitance $C_{gs}$ to the gate voltage $V_g$ characteristic of HFETs remains.

Summarizing the problems to be solved by the invention, in the case of the conventional HFET shown in FIG. 3, the second barrier layer 35 below the gate electrode 40 is etched and a threshold voltage of the transistor is adjusted by the depth of the recess formed by etching. However, it is generally difficult to control the etching amount precisely in etching for forming the recess and the etching amount readily becomes uneven. As a result, the threshold voltage readily becomes uneven.

Also, in the conventional HFET shown in FIG. 4, the gate electrode is joined with the p-type low resistivity region 41 formed buried in the second barrier layer 35. Usually, as the material for the gate electrode, a multilayer structure metal comprised of Ti/Pt/Au stacked sequentially from the junction interface is often used. When the compound semiconductor joined with the gate electrode is for example p-type GaAs, a relatively good ohmic contact can be obtained.

However, generally, in the case of for example AlGaAs and other semiconductors having a larger bandgap than GaAs, it is difficult to incorporate a p-type impurity at a high concentration and it becomes difficult to obtain a good ohmic contact with the above usual gate electrode material. As a result, the contact resistance between the gate electrode and the semiconductor below the gate electrode increases and causes a decline of the high-frequency characteristics.

SUMMARY OF THE INVENTION

An object of the present invention is to provide a semiconductor device able to operate with a single positive power source, able to be reduced in power consumption by improving efficiency, and improved in high-frequency characteristics by lowering the resistance of a gate contact and a process of production of the same.

According to a first aspect of the present invention, there is provided a semiconductor device comprising a carrier run layer formed on a substrate for running of carriers; a carrier supply layer formed on the carrier run layer, having a larger bandgap than the carrier run layer, and containing a first conductivity type impurity; a barrier layer formed on the carrier supply layer and having a smaller bandgap than the carrier supply layer; a source electrode and a drain electrode formed on the barrier layer at a predetermined distance from each other; a gate electrode formed on the barrier layer between the source electrode and the drain electrode away from the source electrode and the drain electrode; and a first low resistivity region formed at least below the gate electrode in the barrier layer and containing a second conductivity type impurity opposite in conductivity to the first conductivity type.

Preferably, a first high resistivity layer having a larger bandgap than the semiconductor comprising the carrier run layer and comprised of an undoped semiconductor is formed between the carrier supply layer and the barrier layer.

More preferably, the device further comprises a second low resistivity layer formed below the first low resistivity region in the first high resistivity layer, containing the second conductivity type impurity, and having a higher resistivity than the first low resistivity region.

Preferably, a second high resistivity layer having a larger bandgap than the semiconductor comprising the carrier run layer and comprised of an undoped semiconductor is formed between the carrier run layer and the carrier supply layer.

Preferably, a buffer layer comprised of an undoped semiconductor is formed between the substrate and the carrier run layer.

Preferably, a cap layer having a smaller bandgap than the semiconductor comprising the carrier supply layer and containing a first conductivity type impurity is formed between the source electrode and the barrier layer and between the drain electrode and the barrier layer.

According to a second aspect of the present invention, there is provided a semiconductor device comprising a first carrier supply layer formed on a substrate and containing a first conductivity type impurity; a carrier run layer formed on the first carrier supply layer and having a smaller bandgap than the first carrier supply layer, and not containing an impurity; a second carrier supply layer formed on the carrier run layer, having a larger bandgap than the carrier run layer, and containing a first conductivity type impurity; a barrier layer formed on the second carrier supply layer and having a smaller bandgap than the second carrier supply layer; a source electrode and a drain electrode formed on the barrier layer at a predetermined distance from each other; a gate electrode formed on the barrier layer between the source electrode and the drain electrode way from the source electrode and the drain electrode; and a first low resistivity region formed at least below the gate electrode in the barrier layer and containing a second conductivity type impurity opposite in conductivity to the first conductivity type.

Preferably, a first high resistivity having a larger bandgap than the semiconductor comprising the carrier run layer and not containing an impurity is formed between the second carrier supply layer and the barrier layer.

More preferably, the device further comprises a second low resistivity layer formed below the first low resistivity region in the first high resistivity layer, containing the second conductivity type impurity, and having a higher resistivity than the first low resistivity region.

Preferably, a second high resistivity layer having a larger bandgap than the carrier run layer and not containing an impurity is formed between the first carrier supply layer and the carrier run layer.

Preferably, a third high resistivity layer having a larger bandgap than the carrier run layer and not containing an impurity is formed between the carrier run layer and the second carrier supply layer.

Preferably, a buffer layer not containing an impurity is formed between the substrate and the first carrier supply layer.

More preferably, a fourth high resistivity layer having a larger bandgap than the carrier run layer and not containing an impurity is formed between the buffer layer and the first carrier supply layer.

Preferably, the carriers are electrons. Further, preferably the substrate is a GaAs substrate.

More preferably, the first carrier supply layer, the carrier run layer, the second carrier supply layer, and the barrier layer are comprised of III–V compound semiconductors.

Preferably, a difference of a lattice constant between the carrier run layer and the carrier supply layer is greater than a difference of the lattice constant between the carrier supply layer and the barrier layer.

Preferably, a cap layer having a smaller bandgap than the semiconductor comprising the second carrier supply layer and containing a first conductivity type impurity is formed between the source electrode and the barrier layer and between the drain electrode and the barrier layer.

Preferably, a difference of a lattice constant between the carrier run layer and the carrier supply layer is greater than a difference of the lattice constant between the carrier supply layer and the barrier layer.

According to the above semiconductor devices of the present invention, since a low resistivity region is formed below the gate electrode, the built-in voltage becomes larger compared with the case using a Schottky barrier in which a metal is directly joined with a barrier layer and it is made possible to supply a higher positive voltage to the gate electrode.

Therefore, it is made possible to operate with a single positive power source and a negative power circuit becomes unnecessary. Due to this, it is made possible to raise the efficiency of a semiconductor device and lower its power consumption. Also, it becomes possible to miniaturize the semiconductor device by omitting a negative power circuit and reducing the mounting area of the chip.

According to the semiconductor device of the present invention, preferably, two low resistivity regions different in resistivity are formed below the gate electrode. As a material of the low resistivity region of an upper layer, a semiconductor material which readily forms an ohmic contact with a metal material comprised of the gate electrode is selected for lowering the resistivity of the low resistivity region in the upper layer. Due to this, it is possible to decrease the resistance at the gate contact and improve high-frequency characteristics of a semiconductor device.

According to the semiconductor device of the present invention, preferably, the high resistivity layer having a larger bandgap than a semiconductor comprising a channel layer is formed between the channel layer and the gate electrode. Due to this, the linearity of the mutual conductance $G_m$ and gate-source capacitance $C_{gs}$ to the gate voltage $V_g$ can be improved and an efficiency of powering is increased. Also, since a parasite resistance component at the channel layer when a positive voltage is supplied to the gate electrode can be decreased, an on-resistance $R_{on}$ at the channel layer can be decreased and a high efficiency of powering can be obtained.

According to a third aspect of the present invention, there is provided a process of production of a semiconductor device comprising the steps of forming on a substrate a carrier run layer for running of carriers; forming on the carrier run layer a carrier supply layer having a larger bandgap than the carrier run layer and containing a first conductivity type impurity; forming on the carrier supply layer a barrier layer having a smaller bandgap than the carrier supply layer; introducing in a part of the barrier layer a second conductivity type impurity opposite in conductivity to the first conductivity type to form a first low resistivity region; forming a source electrode and a drain electrode on the barrier layer to face the first low resistivity region; and forming a gate electrode on the first low resistivity region away from the source electrode and the drain electrode.

According to the above process of production of a semiconductor device of the present invention, after forming epitaxial layers, the low resistivity region is formed by diffusion of the second conductivity type impurity, then the gate electrode forming an ohmic contact with the low resistivity region is formed. Preferably, by diffusing the second conductivity type impurity after forming the first high resistivity layer on the channel layer and stacking the barrier layer on it, it is possible to form low resistivity regions respectively in the first high resistivity layer and the barrier layer at the same production step. Therefore, it is possible to form a semiconductor device having a good ohmic contact at the gate contact by a simplified process.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Preferred embodiments of the semiconductor device of the present invention and the process of production of the same will be explained next with reference to the drawings.

Figure 1:
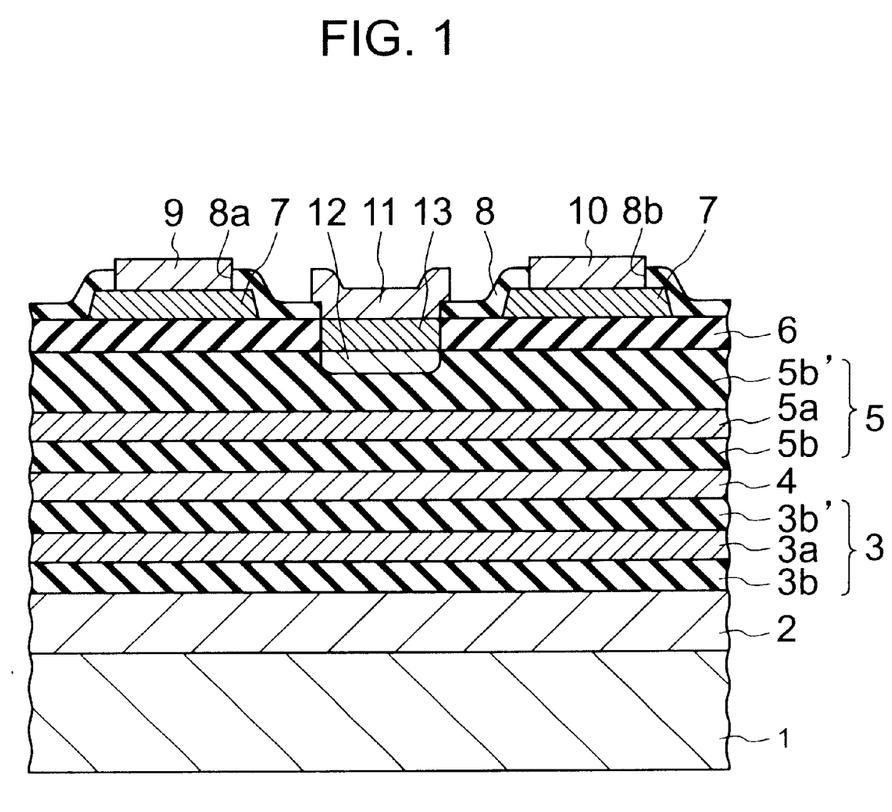
FIG. 1 is a cross-sectional view of a hetero-junction field effect transistor according to an embodiment of the present invention.

FIG. 1 is a cross-sectional view of a semiconductor device of an embodiment of the present invention. The semiconductor device of FIG. 1 is comprised of a substrate 1 made of for example GaAs on which are successively stacked, via a buffer layer 2 comprised of GaAs not containing an impurity (undoped), a first barrier layer 3, a channel layer 4, a second barrier layer 5, and a third barrier layer 6. On the third barrier layer 6 are formed a source electrode 9 and a drain electrode 10 via two cap layers 7.

A gate electrode 11 is formed between the source electrode 9 and the drain electrode 10, and a first p-type low resistivity region 12 is formed in the second barrier layer 5 below the gate electrode 11. Also, a second p-type low resistivity region 13 containing an impurity at a higher concentration than the first p-type low resistivity region 12 and decreased in resistivity is formed in the third barrier layer 6 below the gate electrode 11.

In the above semiconductor device, the channel layer 4 forms a current path between the source electrode 9 and the drain electrode 10.

Next, a detailed explanation will be given about each layer of the semiconductor device of the present embodiment.

The GaAs substrate 1 is composed of a semi-insulating GaAs single crystal containing almost no impurity and having a resistivity of about $10^6$ to $10^8$ Ω. cm. The GaAs substrate 1 is a bulk crystal grown at not less than the melting point of GaAs and contains a relatively large number of lattice defects such as point defects and dislocation. Therefore, if an epitaxial layer is grown directly on the substrate 1, the epitaxial layer near the substrate grown initially cannot always be a crystal of good quality.

If the buffer layer 2 is not formed, the problems sometimes arise that hysteresis is observed in a plot of a drain current against a source/drain voltage (I–V characteristics) or that the mutual conductance $G_m$ decreases in the low current region. To prevent this, it is preferable to form the buffer layer 2 between the substrate 1 and the epitaxial layer.

The buffer layer 2 is formed by epitaxial growth to a thickness of about 3 to 5 μm, for example.

The first barrier layer 3 is composed for example of an $Al_xGa_{1-x}$ As mixed crystal or other III–V compound semiconductor and is structured as a carrier supply region 3a containing an n-type impurity at a high concentration sandwiched between high resistivity layers 3b, 3b'. If an $Al_xGa_{1-x}$As mixed crystal is used as the first barrier layer 3, the composition ratio x of Al is usually 0.2 to 0.3.

The high resistivity layer 3b is an undoped layer having a thickness of about 200 nm and is formed for the same purpose as the buffer layer 2. That is, a good crystalline condition can be obtained at the hertero-junction interface by forming the high resistivity layer 3b.

The carrier supply region 3a is a layer doped with for example silicon as an n-type impurity at about $1.0 \times 10^{12}$ to $2.0 \times 10^{12}$ atoms/cm$^2$ and has a thickness of about 4 nm. Electrons generated from the carrier supply region 3a move to the junction interface with the channel layer 4 to form a channel serving as a current path.

The high resistivity layer 3b' adjacent to the channel layer 4 is an undoped layer having a thickness of about 2 nm. The high resistivity layer 3b' is formed in order to secure the spatial separation between the carrier supply region 3a and the channel layer 4. Since the carrier supply region 3a contains an impurity at a high concentration, part of the potential of the impurity affects the adjacent layer. To prevent the decrease of electron mobility due to scattering caused by the impurity, it is preferable to form the very thin high resistivity layer 3b' between the carrier supply region 3a and the channel layer 4.

As the material of the channel layer 4, a semiconductor having a smaller bandgap than the semiconductor for forming the first barrier layer 3 and the second barrier layer 5, such as an undoped $In_xGa_{1-x}As$ mixed crystal, can be used. Usually, an InGaAs mixed crystal has a larger electron mobility than an AlGaAs mixed crystal. Thus, high-speed electron movement is made possible by using InGaAs as the channel layer 4. If $In_xGa_{1-x}As$ is used as the channel layer 4, the composition ratio x of In is usually 0.1 to 0.2.

The channel layer 4 is supplied with carriers from the carrier supply region 3a of the first barrier layer 3 and from a carrier supply region 5a of the second barrier layer 5 and stores the supplied carriers. The channel layer is formed to an extremely thin thickness of about 10 to 15 nm, that is 20 to 30 layers in terms of the number of layers of atoms. Therefore, there is no freedom of electron movement in the direction perpendicular to the junction interface and a two-dimensional electron gas (2 DEG) characteristic is exhibited.

In an HFET, since an epitaxial layer is formed extremely thinly as described above, whether the crystallinity at the hetero-junction interface between the carrier supply region and the channel layer is good or not becomes an important issue.

The second barrier layer 5 is made of for example an $Al_xGa_{1-x}$ mixed crystal or other III–V compound semiconductor and is structured as a carrier supply region 5a containing an n-type impurity at a high concentration sandwiched between high resistivity layers 5b, 5b'. If an $Al_xGa_{1-x}As$ mixed crystal is used as the second barrier layer 5, the composition ratio x of Al is usually 0.2 to 0.3.

The high resistivity layer 5b adjacent to the channel layer 4 is an undoped layer having a thickness of about 2 nm. The high resistivity layer 5b, in the same way as the high resistivity layer 3b' of the first barrier layer 3, is formed for the purpose of preventing the potential of the high concentration impurity contained in the carrier supply region from soaking the channel layer 4 and causing electron scattering.

The carrier supply region 5a contains an n-type impurity such as silicon at about $1.0 \times 10^{12}$ to $2.0 \times 10^{12}$ atoms/cm$^2$ and has a thickness of about 4 nm.

The high resistivity layer 5b' is an undoped layer having a thickness of about 75 nm. The high resistivity layer 5' is formed for the purpose of securing a spatial separation between the carrier supply region 5a containing an impurity at a high concentration and the third barrier layer 6 formed on the region 5a.

Since the second barrier layer 5 having a larger bandgap than the semiconductor forming the channel layer 4 is formed between the channel layer 4 and the gate electrode 11, the linearity of the mutual conductance $G_m$ and gate-source capacitance $C_{gs}$ to the gate voltage $V_g$ is improved and the efficiency of powering is increased.

As the material of the third barrier layer 6, a semiconductor having a smaller bandgap than the semiconductor forming the second barrier layer 5 and able to be decreased in resistivity by doping a p-type impurity can be used. Specifically, as the third barrier layer 6, a layer comprising of for example GaAs is formed at a thickness of about 10 to 20 nm.

When a p-type impurity is introduced into the semiconductor below the gate electrode to make the gate contact an ohmic contact, a good ohmic contact with a usual gate electrode material cannot be obtained with AlGaAs or another semiconductor of a large bandgap. According to the semiconductor device of the present embodiment, since a good ohmic contact with the gate electrode is formed by providing for example, GaAs layer as the third barrier layer 6 in the part of contact with the gate electrode, the gate resistance can be decreased. Due to this, the high-frequency characteristics of the semiconductor device can be improved.

On the third barrier layer 6, two cap layers 7 are formed with an appropriate space between them. The cap layer 7 comprises GaAs containing an n-type impurity such as silicon at about $4 \times 10^{18}$ atoms/cm$^3$ and has a thickness of about 50 to 100 nm. While a contact resistance occurs due to the interposition of the third barrier layer 6 in the current path, the contact resistance can be decreased by forming the cap layers 7.

An insulating layer 8 comprising for example silicon nitride is formed covering the cap layers 7. The thickness of the insulating layer 8 is for example about 300 nm. In contact holes 8a, 8b formed in the insulating layer 8, the source electrode 9 and the drain electrode 10 are formed respectively. The source electrode 9 and the drain electrode 10 are comprised of an Au—Ge alloy, Ni, and Au stacked sequentially on the cap layers 7. The electrodes form an ohmic contact with the cap layers 7.

Also, a contact hole 8c is formed in the insulating layer 8 between the two cap layers 7, and the gate electrode 11 is formed in the contact hole 8c. The gate electrode 11 is structured by Ti, Pt, and Au sequentially stacked from the substrate side.

The first p-type low resistivity region 12 is formed buried in the high resistivity layer 5b' below the gate electrode 11. The first p-type low resistivity region 12 contains for example Zn as a p-type impurity at about $1.0 \times 10^{19}$ atoms/cm$^3$.

In the third barrier layer 6 between the gate electrode 11 and the first p-type low resistivity region 12 is formed the second p-type low resistivity region 13 containing a p-type impurity at a higher concentration than the first p-type low resistivity region 12. The second p-type low resistivity region 13 contains for example Zn as a p-type impurity at about $2.0 \times 10^{19}$ atoms/cm$^3$.

According to the semiconductor device of the present embodiment, since the first p-type low resistivity region 12 is formed in the second barrier layer 5, the built-in potential becomes larger compared with the case using a Schottky barrier. Therefore, it is made possible to supply a larger positive voltage to the gate electrode 11. Due to this, operation with a single positive power circuit is enabled and a negative power circuit becomes unnecessary. Therefore, it is made possible to decrease the mounting area of the chip.

Further, since the second p-type low resistivity region 13 having a lower resistivity than the first p-type low resistivity region 12 is formed, a good ohmic contact can be obtained compared with the case where the first p-type low resistivity region 12 is directly joined to the gate electrode 11. Due to this, it is made possible to decrease the gate resistance drastically and improve the high-frequency characteristic of the semiconductor device.

Also, since a parasitic resistance component in the channel layer 4 when supplying a positive voltage to the gate electrode 11 is decreased, an on-resistance $R_{on}$ in the channel layer 4 is decreased and a high efficiency of powering can be obtained.

Next, a process of production of the above semiconductor device of the present embodiment will be explained.

Figure 2A:
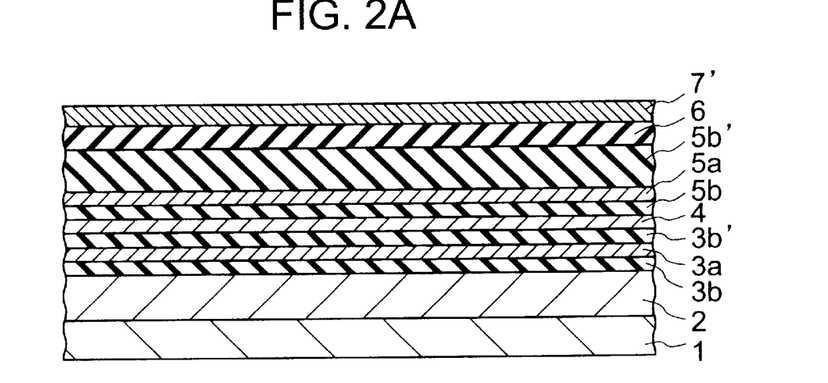
FIG. 2A to 2C are cross-sectional views of steps of the process of production of the semiconductor device of the present invention.

First, as shown in FIG. 2A, for example, an undoped GaAs layer is grown epitaxially as the buffer layer 2 on a substrate 1 comprised of for example a semi-insulating GaAs. The GaAs layer is formed by for example vapor phase epitaxial growth. As methods of growing GaAs epitaxially by a vapor phase, there are the chloride method using $AsCl_3$ as an As source and the hydride method using $AsH_3$, but usually the hydride method is used.

By forming the buffer layer 2, it is possible to improve the crystallinity of the epitaxial layer formed on it. The thickness of the buffer layer 2 is made for example about 3 to 5 μm.

As the first barrier layer 3, a high resistivity layer 3b comprising for example an undoped AlGaAs layer, a carrier supply region 3a comprising an AlGaAs layer containing an n-type impurity, and a high resistivity layer $3b'$ comprising an undoped AlGaAs layer are sequentially grown epitaxially on the buffer layer 2.

In an $Al_xGa_{1-x}As$ mixed crystal formed in a layer as the first barrier layer 3, the composition ratio x of Al is 0.2 to 0.3. The thickness of each of the stacked layers is for example 200 nm for the high resistivity layer $3b$, 4 nm for the carrier supply region $3a$, and 2 nm for the high resistivity layer $3b'$.

Also, in the carrier supply region $3a$, for example, Si is doped as an n-type impurity at about $1.0 \times 10^{12}$ to $2.0 \times 10^{12}$ atoms/cm$^2$. It is preferable to introduce Si in the stage of the epitaxial growth. This is because if Si is diffused after the AlGaAs layer is formed, higher temperature heat treatment than the crystal growth temperature (500 to 600° C.) becomes necessary and the crystal structure of the thin epitaxial layer may be damaged.

As an n-type impurity in the AlGaAs layer, Si is often used, but it is also possible to sue S, Se, Sn, etc. in addition to Si.

The layers constituting the first barrier layer 3 may also be formed by, in addition to vapor phase epitaxial growth the same as the buffer layer 2, by molecular beam epitaxial growth. Molecular beam eptiaxial growth has a lower speed of forming a semiconductor layer compared with other epitaxial growth. For example, the speed of growing GaAs on a GaAs substrate is 0.1 to 2 μm/h. Therefore, while molecular beam epitaxial growth is disadvantageous for forming a thick semiconductor layer, it is advantageous for forming a layer such as an epitaxial layer in an HFET while controlling the crystallinity at the atom-size level.

On the first barrier layer 3, a channel layer 4 is formed by the epitaxial growth of for example an undoped InGaAs layer. On it, a high resistivity layer $5b$ comprised of an undoped AlGaAs layer, a carrier supply region $5a$ comprised of an AlGaAs layer containing an n-type impurity Si, and a high resistivity layer $5b'$ comprised of an undoped AlGaAs layer are sequentially stacked by epitaxial growth as the second barrier layer 5.

These layers can be formed by the same method as the first barrier layer 3 described above. In the $In_xGa_{1-x}As$ mixed crystal of the channel layer 4, the composition ratio x of In is 0.1 to 0.2. In the $Al_xGa_{1-x}As$ mixed crystal formed as the second barrier layer 5, the composition ratio x of Al is 0.2 to 0.3. The thickness of the stacked layers is made for example 10 nm for the channel layer 4, 2 nm for the high resistivity layer $5b$, 4 nm for the carrier supply region $5a$, and 75 nm for the high resistivity layer $5b'$.

Also, for example Si is doped as an n-type impurity in the carrier supply region $5a$ at about $1.0 \times 10^{12}$ to $2.0 \times 10^{12}$ atoms/cm$^2$ in the case of deposition by epitaxial growth.

On the second barrier layer 5, for example, an undoped GaAs layer is epitaxially grown at a thickness of about 10 to 20 nm to form the third barrier layer 6.

On the third barrier layer 6, an n-type GaAs layer 7' for forming the cap layer 7 is epitaxially grown at a thickness of about 50 to 100 nm. In the n-type GaAs layer, for example, Si is contained as an n-type impurity.

After this, the epitaxial layer except for transistor forming regions is removed by mesa etching for forming element isolating regions (not shown). This mesa etching is performed until a depth at which at least a part of the buffer layer 2 is removed. It is also possible that a trench for separation of elements has a depth reaching the substrate 1. Or, instead of performing mesa etching, it is also possible to form a high resistivity layer by ion-implantation of $O^+$or $B^+$for making the element isolating regions.

Figure 2B:
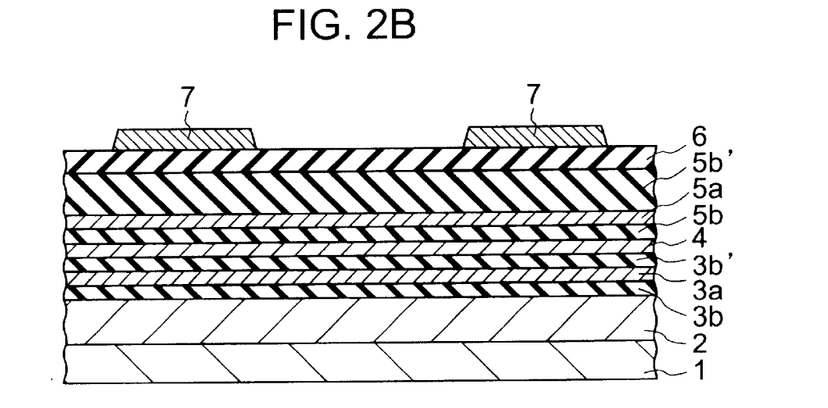

Next, as shown in FIG. 2B, the n-type GaAs layer 7' is selectively removed by etching using a resist as a mask, whereby cap layers 7 are formed in the forming regions of the source electrode 9 and the drain electrode 10. Due to this etching, the third barrier layer 6 of the gate electrode 11 forming region is exposed.

Figure 2C:
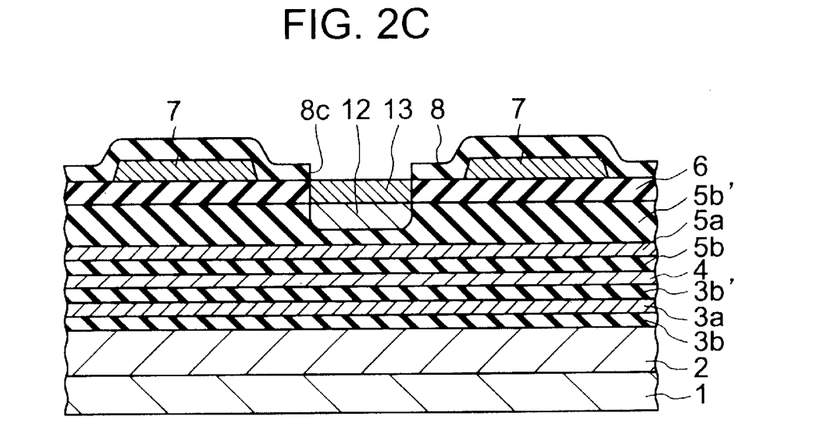

Next, as shown in FIG. 2C, a silicon nitride layer is deposited covering the cap layers 7 and the third barrier layer 6 by for example chemical vapor deposition (CVD) to form the insulating layer 8.

After this, the insulating layer 8 of the gate electrode forming region is selectively removed by etching to form the contact hole $8c$. A p-type impurity, for example Zn, is diffused by vapor phase into the third barrier layer 6 and the second barrier layer 5 at about 600° C. via the contact hole $8c$.

For diffusing zinc in a vapor phase, it is possible to use a gas containing for example a liquid organic metal, diethylzinc (DEZ; $Zn(C_2H_5)_2$) or dimethylzinc (DMS: $ZN(CH_3)_2$), and arsine ($AsH_3$). Diethylzinc or dimethylzinc is a liquid organic metal at room temperature and a general source of zinc for vapor diffusion into a compound semiconductor. Such a zinc compound becomes a gas when bubbled with hydrogen of high purity as a carrier gas and is introduced into a furnace tube.

Arsine is provided for the purpose of preventing the change of the GaAs composition due to the evaporation of arsine having a high vapor pressure from the surface of the third barrier layer 6.

Due to the above vapor phase diffusion, the first p-type low resisitivty region 12 is formed in the high resistivity layer $5b'$ of the second barrier layer 5. Also, the second p-type low resistivity region 13 containing a p-type impurity at a higher concentration than the first p-type low resistivity region 12 and having a lower resistivity is formed in the third barrier layer 5.

The diffusion of Zn is performed at about the same temperature as the crystal growth temperature of the epitaxial layers (500 to 600° C.).

Next, a metal layer for forming the gate electrode 11 is formed contacting the second p-type low resistivity region 13 in the contact hole $8c$. For example, titanium, platinum, and gold are stacked by electron beam deposition etc. at a thickness of respectively 30 nm/50 nm/120 nm. On the stacked metal layers, a resist having a pattern of the gate electrode is formed. Using the resist as a mask, the stacked metal layers are processed by ion milling using for example argon gas to form the gate electrode 11.

Next, as shown in FIG. 1, the insulating layer 8 at the source electrode 9 forming region and the drain electrode 10 forming region is selectively etched to form the contact holes $8a$, $8b$ respectively. In the contact holes $8a$, $8b$, for example gold-germanium and nickel are sequentially deposited and the deposited metal layers are patterned. Next, heat treatment at for example about 400° C. is performed for alloying, whereby the source electrode 9 and the drain electrode 10 are formed.

Due to the above process, the semiconductor device shown in FIG. 1 can be obtained.

According to the process of production of a semiconductor device of the present embodiment, it is possible to form the first p-type low resistivity region 12 in the barrier layer 5 below the gate electrode 11 and form the second p-type low resistivity region 13 containing an impurity at a higher concentration than the first p-type low resistivity region 12 in the barrier layers 6 by the same vapor diffusion process. By forming the first and the second p-type low resistivity region 12, 13, the gate contact becomes an ohmic contact and the gate resistance can be decreased. Therefore, according to the process of production of the present embodiment, it is mad possible to produce a semiconductor device improved in high-frequency characteristics by a simplified process.

The semiconductor device of the present invention and the process of production of the same are not limited to the embodiments explained above. For example, it is also possible to make the hetero-junction formed in the HFET InGaAs/AlInAs instead of the above GaAs/AlGaAs or InGaAs/AlGaAs. Also, the thickness of each layer in the epitaxial layers may be changed in accordance with the design of the semiconductor device.

In addition, various modifications may be made within a range not outside the gist of the present invention.

Summarizing the effects of the invention, according to the present invention, it is possible to provide a semiconductor device able to operate with a single positive power source, improved in efficiency, decreased in resistivity of a gate contact, and improved in high-frequency characteristics.

According to the present invention, it is possible to further provide a process for production of a semiconductor device forming an ohmic contact at a gate contact by a simplified process and improving the performance of the semiconductor device.

What is claimed is:

1. A semiconductor device comprising:
   a substrate;
   a carrier run layer formed on the substrate for running of carriers;
   a first barrier layer having a carrier supply layer of a first conductivity type impurity formed on the carrier run layer and having larger bandgap than the carrier run layer;
   a second barrier layer formed on the first barrier layer and having a smaller bandgap than the carrier supply layer;
   a source electrode and a drain electrode formed on the second barrier layer at a predetermined distance from each other;
   a gate electrode formed on the second barrier layer between the source electrode and the drain electrode away from the source electrode and the drain electrode; and
   a first low resistivity region formed at least below the gate electrode in the first and second barrier layers and containing a second conductivity type impurity opposite in conductivity to the first conductivity type.

2. A semiconductor device as set forth in claim 1, wherein a first high resistivity layer having a larger bandgap than the semiconductor comprising the carrier run layer and comprised of an undoped semiconductor is formed between the carrier supply layer and the barrier layer.

3. A semiconductor device as set forth in claim 2, further comprising a second low resistivity region formed below the first low resistivity region in the first high resistivity layer, containing the second conductivity type impurity, and having a higher resistivity than the first low resistivity region.

4. A semiconductor device as set forth in claim 1, wherein a second high resistivity layer having a larger bandgap than the semiconductor comprising the carrier run layer and comprised of an undoped semiconductor is formed between the carrier run layer and the carrier supply layer.

5. A semiconductor device as set forth in claim 1, wherein a buffer layer comprising an undoped semiconductor is formed between the substrate and the carrier run layer.

6. A semiconductor device as set forth in claim 1, wherein a cap layer having a smaller bandgap than the semiconductor comprising the carrier supply layer and containing a first conductivity type impurity is formed between the source electrode and the barrier layer and between the drain electrode and the barrier layer.

7. A semiconductor device comprising:
   a substrate;
   a first carrier supply layer formed on the substrate and containing a first conductivity type impurity;
   a carrier run layer formed on the first carrier supply layer and having a smaller bandgap than the first carrier supply layer and not containing an impurity;
   a first barrier layer having a second carrier supply layer of a first conductivity type impurity formed on the carrier run layer and having larger bandgap than the carrier run layer;
   a second barrier layer formed on the first barrier layer and having a smaller bandgap than the second carrier supply layer;
   a source electrode and a drain electrode formed on the second barrier layer at a predetermined distance from each other;
   a gate electrode formed on the second barrier layer between the source electrode and the drain electrode away from the source electrode and the drain electrode; and
   a first low resistivity region formed at least below the gate electrode in the first and second barrier layers and containing a second conductivity type impurity opposite in conductivity to the first conductivity type.

8. A semiconductor device as set forth in claim 7, wherein a first high resistivity layer having a larger bandgap than the semiconductor comprising the carrier run layer and not containing an impurity is formed between the second carrier supply layer and the barrier layer.

9. A semiconductor device as set forth in claim 8, further comprising a second low resistivity layer formed below the first low resistivity region in the first high resistivity layer, containing the second conductivity type impurity, and having a higher resistivity than the first low resistivity region.

10. A semiconductor device as set forth in claim 7, wherein a second high resistivity layer having a larger bandgap than the carrier run layer and not containing an impurity is formed between the first carrier supply layer and the carrier run layer.

11. A semiconductor device as set forth in claim 7, wherein a third high resistivity layer having a larger bandgap than the carrier run layer and not containing an impurity is formed between the carrier run layer and the second carrier supply layer.

12. A semiconductor device as set forth in claim 7, wherein a buffer layer not containing an impurity is formed between the substrate and the first carrier supply layer.

13. A semiconductor device as set forth in claim 12, wherein a fourth high resistivity layer having a larger bandgap than the carrier run layer and not containing an impurity is formed between the buffer layer and the first carrier supply layer.

14. A semiconductor device as set forth in claim 7, wherein the carriers are electrons.

15. A semiconductor device as set forth in claim 7, wherein the substrate is a GaAs substrate.

16. A semiconductor device as set forth in claim 15, wherein the first carrier supply layer, the carrier run layer, the second carrier supply layer, and the barrier layer are comprised of III–V compound semiconductors.

17. A semiconductor device as set forth in claim 7, wherein a difference of a lattice constant between the carrier run layer and the carrier supply layer is greater than a difference of the lattice constant between the carrier supply layer and the barrier layer.

18. A semiconductor device as set forth in claim 7, wherein a cap layer having a smaller bandgap than the semiconductor comprising the second carrier supply layer and containing a first conductivity type impurity is formed between the source electrode and the barrier layer and between the drain electrode and the barrier layer.

19. A semiconductor device as set forth in claim 1, wherein a difference of a lattice constant between the carrier run layer and the carrier supply layer is greater than a difference of the lattice constant between the carrier supply layer and the barrier layer.

\* \* \* \* \*